(12) United States Patent
Molina et al.

(10) Patent No.: US 10,742,225 B1
(45) Date of Patent: Aug. 11, 2020

(54) N-BIT SUCCESSIVE APPROXIMATION REGISTER ANALOG-TO-DIGITAL CONVERTER AND METHOD FOR CALIBRATING THE SAME, RECEIVER, BASE STATION AND MOBILE DEVICE

(71) Applicant: Intel Corporation, Santa Clara, CA (US)

(72) Inventors: Albert Molina, Novelda (ES); Martin Clara, Santa Clara, CA (US); Matteo Camponeschi, Villach (AT); Christian Lindholm, Villach (AT); Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/728,226

(22) Filed: Dec. 27, 2019

(51) Int. Cl.
  *H03M 1/10* (2006.01)
  *H04B 1/16* (2006.01)

(52) U.S. Cl.
  CPC .......... *H03M 1/1009* (2013.01); *H04B 1/16* (2013.01)

(58) Field of Classification Search
  None
  See application file for complete search history.

(56) References Cited

U.S. PATENT DOCUMENTS

| | | | | |
|---|---|---|---|---|
| 6,268,813 B1 * | 7/2001 | de Wit | ................... | H03M 1/108 341/120 |
| 7,812,757 B1 * | 10/2010 | Wong | ..................... | H03M 1/468 341/155 |
| 10,505,561 B2 * | 12/2019 | Bodnar | ................. | H03M 1/201 |
| 2002/0193140 A1 * | 12/2002 | Behrens | ............... | H04B 1/0003 455/553.1 |
| 2008/0132195 A1 * | 6/2008 | Maxim | .................. | H04B 1/001 455/334 |
| 2011/0285568 A1 * | 11/2011 | Harpe | ..................... | H03M 1/56 341/158 |

(Continued)

*Primary Examiner* — Lana N Le
(74) *Attorney, Agent, or Firm* — 2SPL Patent Attorneys PartG mbB

(57) ABSTRACT

A n-bit Successive Approximation Register Analog-to-Digital Converter, SAR ADC, is provided. The SAR ADC comprises a respective plurality of sampling cells for each bit of the n-bit of the SAR ADC. Each sampling cell comprises a capacitive element coupled to a cell output of the sampling cell in order to provide a cell output signal. Further, each sampling cell comprises a first cell input for receiving a first signal, and a first switch circuit capable of selectively coupling the first cell input to the capacitive element. Each cell additionally comprises a second cell input for receiving a second signal, and a third cell input for receiving a third signal. The third signal exhibits opposite polarity compared to the second signal. Each sampling cell comprises a second switch circuit capable of selectively coupling one of the second cell input and the third cell input to the capacitive element. The SAR ADC further comprises at least one comparator circuit coupled to the sampling cells. The at least one comparator circuit is configured to output a comparison signal based on the cell output signals of the sampling cells. Additionally, the SAR ADC comprises a calibration circuit configured to supply at least one respective control signal to the respective second switch circuit of the sampling cells for controlling the second switch circuits.

25 Claims, 7 Drawing Sheets

(56) References Cited

U.S. PATENT DOCUMENTS

| | | | |
|---|---|---|---|
| 2014/0167988 A1* | 6/2014 | Hong | H03M 1/1061 |
| | | | 341/110 |
| 2015/0381192 A1* | 12/2015 | Yamamoto | H03M 1/468 |
| | | | 341/120 |
| 2017/0187414 A1* | 6/2017 | Talty | H04B 1/1036 |
| 2017/0244424 A1* | 8/2017 | Liu | H03M 1/145 |
| 2019/0181889 A1* | 6/2019 | Menkhoff | H04B 1/0007 |
| 2019/0288653 A1* | 9/2019 | Yoo | H03F 3/2173 |
| 2020/0067551 A1* | 2/2020 | Ghannouchi | H04B 1/28 |

* cited by examiner

Fig. 4

Calibration Measurement $S_i$ $w_3 + w_2 + w_1 - w_0 \sim 205$
$w_3 + w_2 + w_1 - w_0$
$w_3 + w_2 - w_0$
$w_3 + w_2 - w_1 - w_0$
$w_3 - w_2 + w_1 - w_0$
$w_3 - w_0$
$w_3 - w_2 - w_1 - w_0$
$w_3 - w_2 - w_0$
$-w_3 + w_2 + w_1 w_0$
$-w_0$
$-w_3 + w_2 - w_1 - w_0$
$-w_3 + w_2 - w_0$
$-w_3 - w_2 + w_1 - w_0$
$-w_3 - w_0$
$-w_3 - w_2 - w_0$
$-w_3 - w_2 - w_1 - w_0$ ← decision threshold

400

N-BIT SUCCESSIVE APPROXIMATION REGISTER ANALOG-TO-DIGITAL CONVERTER AND METHOD FOR CALIBRATING THE SAME, RECEIVER, BASE STATION AND MOBILE DEVICE

FIELD

The present disclosure relates to analog-to-digital conversion. In particular, examples relate to a n-bit Successive Approximation Register Analog-to-Digital Converter (SAR ADC) and a method for calibrating the same. Further examples relate to a receiver, a base station and a mobile device.

BACKGROUND

Split capacitor SAR ADC architectures have significant advantages from an analog implementation point of view. However, conventional split capacitor SAR ADCs are difficult to calibrate since the weight of the Least Significant Bit (LSB) of the split capacitor SAR ADC is not a function of the comparator decisions. As a consequence, it is difficult to estimate the LSB. However, the LSB weight is an important quantity. For example, if a split capacitor SAR ADC is used in a pipeline ADC, it is important to have an estimate for the LSB weight.

Hence, there may be a desired for an improved SAR ADC architecture.

BRIEF DESCRIPTION OF THE FIGURES

Some examples of apparatuses and/or methods will be described in the following by way of example only, and with reference to the accompanying figures, in which

FIG. 4 illustrates a third example of decision thresholds;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
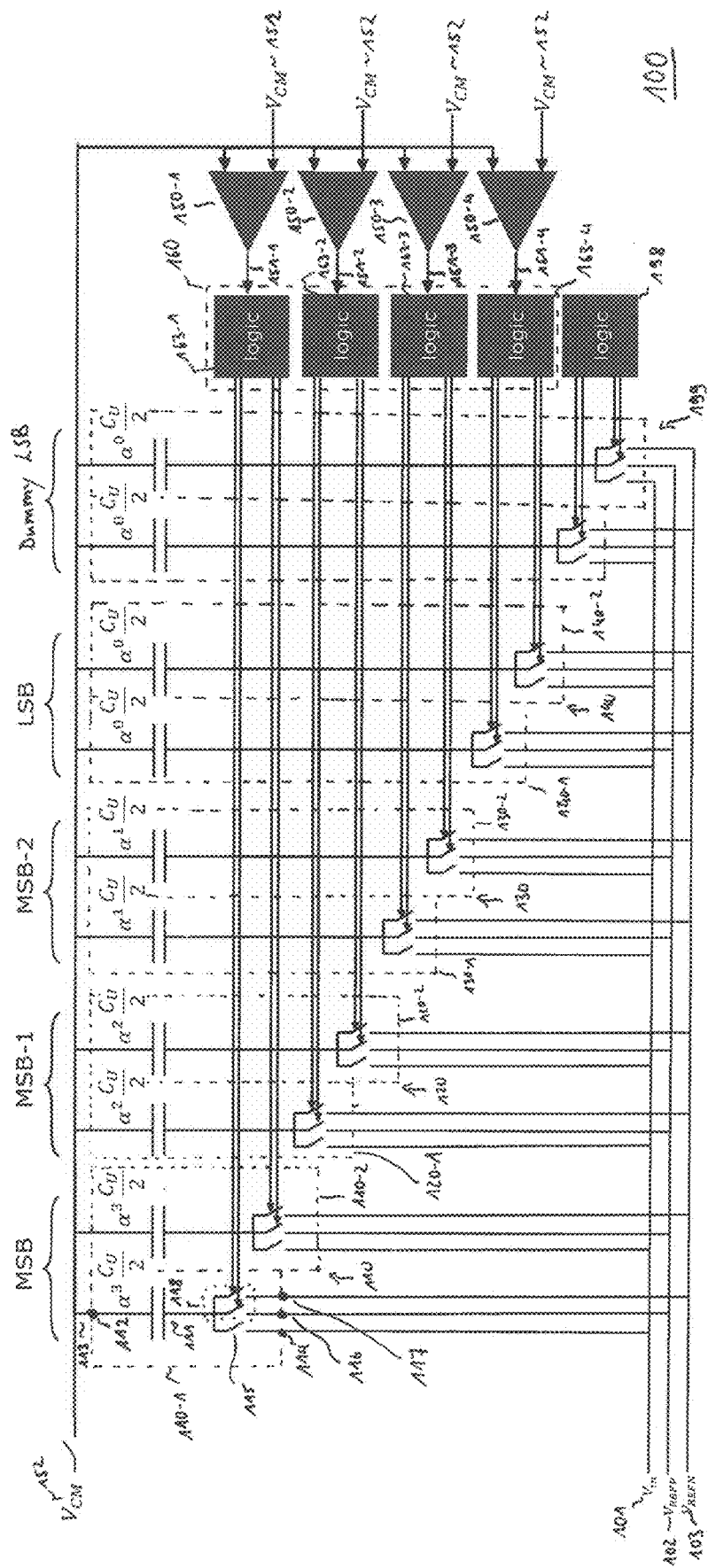
FIG. 1 illustrates an example of a n-bit SAR ADC.

FIG. 1 illustrates an example of a n-bit SAR ADC 100. In the example of FIG. 1, the SAR ADC 100 is depicted as an n=4-bit ADC. Accordingly, the proposed SAR ADC architecture will be described with reference to a 4-bit ADC. However, it is to be noted that the proposed architecture is not limited to 4-bit SAR ADCs. In general, the proposed architecture may be used for any number of bits n>1.

The SAR ADC 100 comprises a respective plurality of sampling cells for each bit of the n=4-bit. That is, the SAR ADC 100 comprises a plurality of sampling cells 110 for the $1^{st}$ Most Significant Bit (MSB) of the 4-bit, a plurality of sampling cells 120 for the $2^{nd}$ MSB of the 4-bit (MSB-1), a plurality of sampling cells 130 for the $3^{rd}$ MSB of the 4-bit (MSB-2), and a plurality of sampling cells 140 for the $4^{th}$ MSB of the 4-bit (i.e. the LSB). In the example of FIG. 1, each plurality of sampling cells 110, . . . , 140 comprises two respective sampling cells. However, it is to be noted that the proposed architecture is not limited to two sampling cells per bit. In general, any number m>1 of sampling cells may be used for each bit of the n-bit.

Further illustrated in FIG. 1 is a plurality of sampling cells 199 for a dummy LSB that allow dummy switching during operation of the SAR ADC 100. The sampling cells 199 for the dummy LSB are not needed for calibration and will, hence, not described in detail in following. In some examples, the sampling cells 199 for the dummy LSB may be omitted.

The individual sampling cells of the pluralities of sampling cells 110, . . . , 140 (and also the plurality of sampling cells 199 for the dummy LSB) are substantially identical. The structure of the sampling cells will be exemplarily described in the following for the sampling cell 110-1 of the plurality of sampling cells 110 for the $1^{st}$ MSB.

The sampling cell 110-1 comprises a capacitive element 111 coupled to a cell output (node) 112 of the sampling cell 110-1 for providing a cell output signal 113. Further, the sampling cell 110-1 comprises a first cell input (node) 114 for receiving a first signal 101, and a first switch circuit 115 capable of selectively coupling the first cell input 114 to the capacitive element 111. The sampling cell 110-1 additionally comprises a second cell input (node) 116 for receiving a second signal 102, and a third cell input (node) 117 for receiving a third signal 103. The sampling cell 110-1 comprises a second switch circuit 118 capable of selectively coupling one of the second cell input 116 and the third cell input 117 to the capacitive element 111. For example, the first switch circuit 115 and the second switch circuit 118 may be implemented as semiconductor switches (e.g. comprising one or more transistors).

The first signal 101 is a calibration signal, the second signal 102 is a first reference signal, and the third signal 103 is a second reference signal. The third signal 103 exhibits opposite polarity compared to the second signal 102.

In the example of FIG. 1, the first cell input 114 of the sampling cell 110-1 is a cell input of the sampling cell used for receiving an input signal to be digitized during non-calibration operation of the SAR ADC (i.e. when the SAR ADC is not calibrated). In other words, SAR ADC 100 uses the regular cell input of the sampling cell 110-1 for receiving (inputting, injecting) the calibration signal to the sampling cell 110-1. In other examples, the first cell input 114 may be a dedicated cell input used only for receiving calibration signals.

The SAR ADC 100 is a split capacitor SAR ADC.

The capacitive elements of a respective one of the pluralities of sampling cells 110, ..., 140 for the individual bits of the n=4-bit exhibit the same capacitance. As indicated in FIG. 1, each capacitive element of the plurality of sampling cells 110 for the $1^{st}$ MSB exhibits the capacitance $\alpha^3 \cdot C_U/2$ ($C_U$ denotes a unit capacitance), each capacitive element of the plurality of sampling cells 120 for the $2^{nd}$ MSB exhibits the capacitance $\alpha^2 \cdot C_U/2$, each capacitive element of the plurality of sampling cells 130 for the $3^{rd}$ MSB exhibits the capacitance $\alpha^1 \cdot C_U/2$, and each capacitive element of the plurality of sampling cells 140 for the $4^{th}$ MSB exhibits the capacitance $\alpha^0 \cdot C_U/2$. In other words, each capacitive element of a respective plurality of sampling cells for a bit of the n=4-bit exhibits a bit-specific capacitance.

The capacitive elements of a respective one of the pluralities of sampling cells 110, ..., 140 for the individual bits of the n=4-bit exhibit a respective capacitance which corresponds to the significance of the respective bit. That is, the capacitance $\alpha^3 \cdot C_U/2$ of the capacitive elements of the plurality of sampling cells 110 for the $1^{st}$ MSB corresponds to the significance of the $1^{st}$ MSB, the capacitance $\alpha^2 \cdot C_U/2$ of the capacitive elements of the plurality of sampling cells 120 for the $2^{nd}$ MSB corresponds to the significance of the $2^{nd}$ MSB, etc.

Therefore, the capacitive elements of different ones of the pluralities of sampling cells 110, ..., 140 for the individual bits of the n=4-bit exhibit different capacitances. The capacitance $\alpha^3 \cdot C_U/2$ of the plurality of sampling cells 110 for the $1^{st}$ MSB is different from the capacitance $\alpha^2 \cdot C_U/2$ of the capacitive elements of the plurality of sampling cells 120 for the $2^{nd}$ MSB, the capacitance $\alpha^2 \cdot C_U/2$ of the capacitive elements of the plurality of sampling cells 120 for the $2^{nd}$ MSB is different from the capacitance $\alpha^1 \cdot C_U/2$ of the capacitive elements of the plurality of sampling cells 130 for the $3^{rd}$ MSB, etc.

The SAR ADC 100 further comprises at least one comparator circuit coupled to (the cell outputs of) the sampling cells of the pluralities of sampling cells 110, ..., 140. In the example of FIG. 1, four comparator circuit 150-1, ..., 150-4 are illustrated as the SAR ADC 100 comprises a respective comparator circuit for each of the n=4-bit. In alternative examples, a single (i.e. only one) comparator circuit may be used for all of the n=4-bit. The comparator circuits 150-1, ..., 150-4 are configured to output a respective comparison signal 151-1, ..., 151-4 based on the cell output signals of the sampling cells of the pluralities of sampling cells 110, ..., 140. Accordingly, if a single comparator circuit is used, the comparator circuit is configured to output a single comparison signal based on the cell output signals of the sampling cells.

In the example of FIG. 1, the cell output signals of the sampling cells of the pluralities of sampling cells 110, ..., 140 are combined and supplied to a respective first comparator input (node) of each of the comparator circuits 150-1, ..., 150-4. Further, a comparison reference signal 152 is input to a respective second comparator input (node) of each of the comparator circuits 150-1, ..., 150-4. Each of the comparator circuits 150-1, ..., 150-4 is configured to compare the comparison reference signal 152 to the combined cell output signals of the sampling cells of the pluralities of sampling cells 110, ..., 140, and to generate the respective comparison signal 151-1, ..., 151-4 based on the comparison of the comparison reference signal 152 to the combined cell output signals of the sampling cells of the pluralities of sampling cells 110, ..., 140. For example, depending on which of the comparison reference signal 152 and the combined cell output signals of the sampling cells of the pluralities of sampling cells 110, ..., 140 exhibits the higher signal level, the respective comparator circuit 150-1, ..., 150-4 may adjust the signal level of the respective comparison signal 151-1, ..., 151-4 (e.g. high or low depending on which of the signals input to the respective comparator circuit exhibits the higher/lower signal level).

The SAR ADC 100 additionally comprises a calibration circuit 160 configured to supply at least one respective control signal to the respective second switch circuit of the sampling cells of the pluralities of sampling cells 110, ..., 140 for controlling the second switch circuits. In the example of FIG. 1, the calibration circuit 160 supplies two respective control signals to the respective second switch circuit of each of the sampling cells. For example, the calibration circuit 160 supplies the two control signals 161-1 and 162-1 to the second switch circuit 118 of the sampling cell 110-1. However, it is to be noted that in alternative examples more or less control signals may be supplied to the respective second switch circuit of the sampling cells of the pluralities of sampling cells 110, ..., 140 for controlling the second switch circuits.

In the example of FIG. 1, the calibration circuit 160 comprises a respective logic circuit 163-1, ..., 163-4 for each of the n=4-bit. For example, the logic circuit 163-1, ..., 163-4 may implement the respective SAR logic for each of the n=4-bit. However, it is to be noted that in alternative examples, a single (i.e. only one) or less than n logic circuits implementing the SAR logic may be used. Further illustrated is a logic circuit 198 configured to supply control signals to the second switch circuits of the plurality of sampling cells 199 for controlling the second switch circuits of the plurality of sampling cells 199 for the dummy LSB.

For calibration, the calibration circuit 160 may be configured to supply the respective control signal(s) to the respective second switch circuit of the sampling cells of the pluralities of sampling cells 110, ..., 140 in order to adjust a decision threshold for the comparator circuits 150-1, ..., 150-4 during calibration.

The SAR ADC 100 may enable facilitated calibration. In particular, the SAR ADC 100 may enable facilitated estimation of the weight of the LSB (e.g. the $4^{th}$ MSB in the example of FIG. 1). This will become clearer from the following description of the proposed calibration scheme.

For a n-bit SAR ADC, the proposed calibration scheme comprises n+1 calibration measurements in order to determine the respective weight of the sampling cells for each of the n-bit. For the 4-bit SAR ADC 100 illustrated in FIG. 1, the calibration scheme, hence, comprises five calibration measurements.

For the first calibration measurement, the calibration circuit 160 is configured to control the second switch circuits of one half of the sampling cells for each bit of the n=4-bit to couple the respective second cell input to the respective capacitive element, and to control the second switch circuits of the other half of the sampling cells for each bit of the n=4-bit to couple the respective third cell input to the respective capacitive element. In other words, for each of the n=4-bit, one sampling cell is controlled to couple its second cell input to its capacitive element, and the other sampling cell is controlled to couple its third cell input to its capacitive element. For example, for the $1^{st}$ MSB, the sampling cell 110-1 may be controlled to couple its second cell input to its capacitive element, and the sampling cell 110-2 may be controlled to couple its second cell input to its capacitive element. The sampling cells for the other bits may be controlled analogously.

Figure 2:
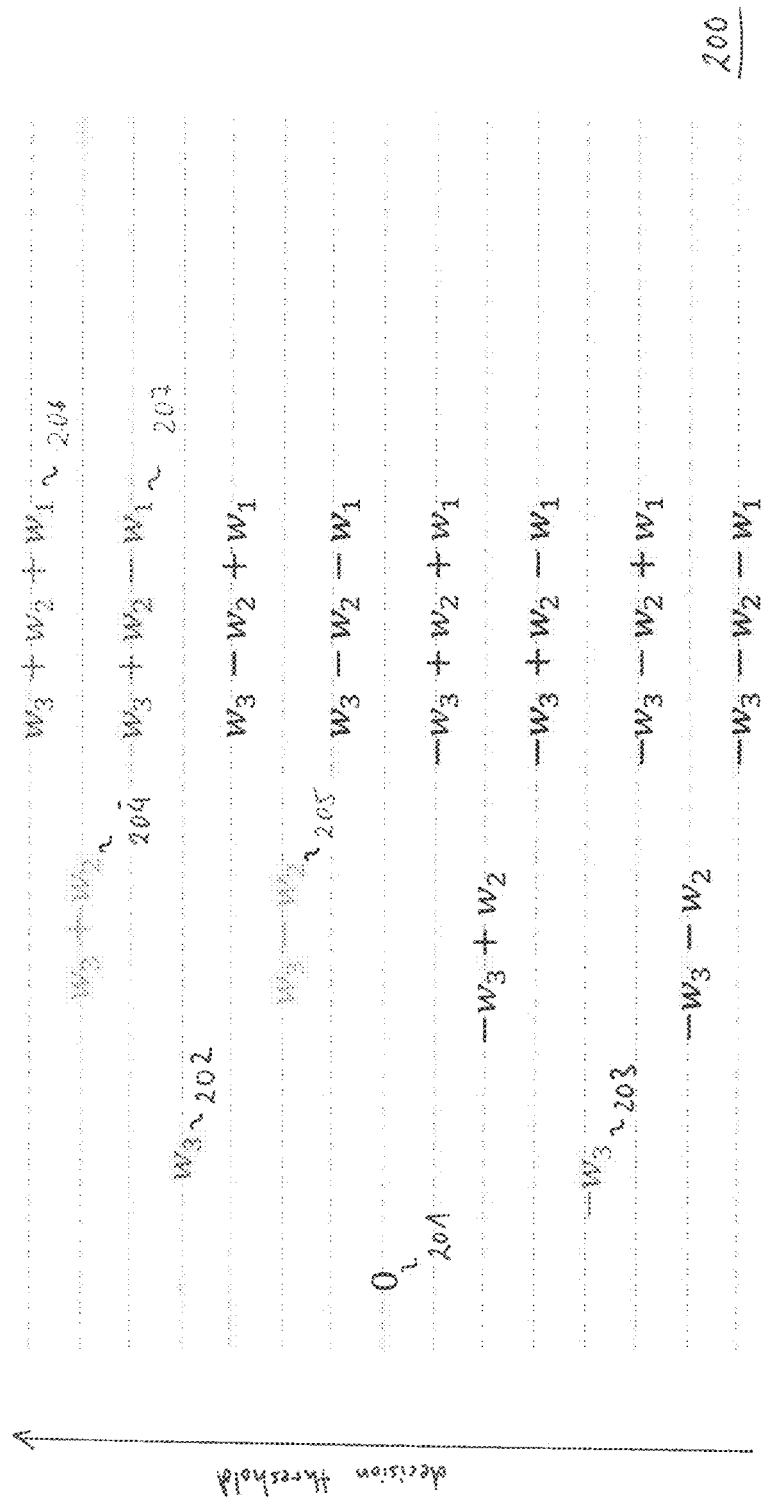
FIG. 2 illustrates a first example of decision thresholds.

Coupling one half of each bit to the first reference signal and other half to the other reference signal sets the decision threshold for the comparator circuits 150-1, ..., 150-4 initially to zero. This is illustrated in FIG. 2, which shows an exemplary decision tree 200 of the SAR ADC 100. The initially set decision threshold 201 is zero. The decisions of the comparator circuits 150-1, ..., 150-4 based on the decision threshold 201 do not contain any information about the weight of the $1^{st}$ MSB. During the first calibration measurement, the calibration circuit 160 is configured to control the first switch circuit of each sampling cell of the pluralities of sampling cells 110, ..., 140 to decouple the respective first cell input from the respective capacitive element.

Further, i-th calibration measurements (1<i<n+1) are performed for determining the weights of the n−1 MSBs. For the n=4-bit SAR ADC 100 illustrated in FIG. 1, the calibration scheme, hence, comprises n−1=3 further calibration measurements (i.e. calibration measurements 2 to 4).

For each of the i-th calibration measurements, the calibration circuit 160 is configured to respectively control the second switch circuits of the sampling cells for the i−1st MSB of the n=4-bit to sequentially couple the respective second cell input and the respective third cell input to the respective capacitive element. Further, if i>2, the calibration circuit 160 is configured to respectively control the second switch circuits of the sampling cells for the bits up to the i−2nd MSB to couple a selected one of the respective second cell input and the respective third cell input to the respective capacitive element. Additionally, the calibration circuit 160 is configured to respectively control the second switch circuits of one half of the sampling cells for each of the i-th to n-th MSBs to couple the respective second cell input to the respective capacitive element, and to respectively control the second switch circuits of the other half of the sampling cells for each of the i-th to n-th MSBs to couple the respective third cell input to the respective capacitive element.

Further, for each of the i-th calibration measurements, the calibration circuit 160 is configured to control the respective first switch circuit of the sampling cells for each bit of the n=4-bit to couple the respective first cell input to the respective capacitive element during calibration. The calibration signal exhibits an increasing or decreasing signal level over time. In other words, the calibration signal allows to sweep a DC value into the SAR ADC 100.

For the $2^{nd}$ calibration measurement, the calibration circuit 160 in the example of FIG. 1 is configured to respectively control the second switch circuits of the sampling cells 110-1 and 110-2 for the $1^{st}$ MSB to sequentially couple the respective second cell input and the respective third cell input to the respective capacitive element. For example, the second switch circuits of the sampling cells 110-1 and 110-2 for the $1^{st}$ MSB may be controlled to first couple (only, exclusively) the respective second cell input to the respective capacitive element and then (only, exclusively) the respective third cell input, or vice versa. Further, the calibration circuit 160 is configured to respectively control the second switch circuits of one half of the sampling cells for each of the $2^{nd}$ to $4^{th}$ MSBs to couple the respective second cell input to the respective capacitive element, and to respectively control the second switch circuits of the other half of the sampling cells for each of the $2^{nd}$ to $4^{th}$ MSBs to couple the respective third cell input to the respective capacitive element. For example, the second switch circuits of the sampling cells 120-1, 130-1 and 140-1 may be controlled to couple the respective second cell input to the respective capacitive element, and the sampling cells 120-2, 130-3 and 140-2 may be controlled to couple the respective third cell input to the respective capacitive element.

For the $2^{nd}$ calibration measurement, the decision threshold for the comparator circuits 150-1, ..., 150-4 is therefore sequentially set to the decision thresholds 202 and 203, which convey information about the weight $w_3$ of the sampling cells 110-1 and 110-2 of the $1^{st}$ MSB. In particular, the decision threshold 202 corresponds to $+w_3$ and the decision threshold 203 corresponds to $-w_3$. Since the calibration signal with increasing or decreasing signal level is input during the $2^{nd}$ calibration measurement, the threshold crossings around $-w_3$ and $+w_3$ can be detected in the comparison signals 151-1, ..., 151-4 of the comparator circuits 150-1, ..., 150-4. Accordingly, two measurements value $-w_3$ and $+w_3$ for the weight $w_3$ of the sampling cells 110-1 and 110-2 of the $1^{st}$ MSB are obtained. By subtracting the measurements value $-w_3$ and $+w_3$ from each other, an estimate for the weight $w_3$ of the sampling cells 110-1 and 110-2 of the $1^{st}$ MSB may be obtained by the calibration circuit 160.

For the $3^{rd}$ calibration measurement, the calibration circuit 160 in the example of FIG. 1 is configured to respectively control the second switch circuits of the sampling cells 120-1 and 120-2 for the $2^{nd}$ MSB to sequentially couple the respective second cell input and the respective third cell input to the respective capacitive element. For example, the second switch circuits of the sampling cells 120-1 and 120-2 for the $2^{nd}$ MSB may be controlled to first couple (only, exclusively) the respective second cell input to the respective capacitive element and then (only, exclusively) the respective third cell input, or vice versa.

Further, since i=3>2, the calibration circuit 160 is configured to respectively control the second switch circuits of the sampling cells 110-1 and 110-2 for the $1^{st}$ MSB to couple a selected one of the respective second cell input and the respective third cell input to the respective capacitive element. The calibration circuit 160 is configured to select the selected one of the respective second cell input and the respective third cell input based on the comparison signals 151-1, ..., 151-4 for the $1^{st}$ calibration measurement. For example, if the signal amplitude of the reference signal 152 is lower than the combined cell output signals of the sampling cells of the pluralities of sampling cells 110, ...,

140 in the $1^{st}$ calibration measurement, the respective second cell input may be selected as the selected one of the respective second cell input and the respective third cell input, or vice versa. In the following it will be assumed that the respective second cell input is selected as the selected one of the respective second cell input and the respective third cell input.

Further, the calibration circuit 160 is configured to respectively control the second switch circuits of one half of the sampling cells for each of the $3^{rd}$ to $4^{th}$ MSBs to couple the respective second cell input to the respective capacitive element, and to respectively control the second switch circuits of the other half of the sampling cells for each of the $3^{rd}$ to $4^{th}$ MSBs to couple the respective third cell input to the respective capacitive element. For example, the second switch circuits of the sampling cells 130-1 and 140-1 may be controlled to couple the respective second cell input to the respective capacitive element, and the sampling cells 130-2 and 140-2 may be controlled to couple the respective third cell input to the respective capacitive element.

For the $3^{rd}$ calibration measurement, the decision threshold for the comparator circuits 150-1, ..., 150-4 is therefore sequentially set to the decision thresholds 204 and 205, which convey information about the weight $w_2$ of the sampling cells 120-1 and 120-2 of the $2^{nd}$ MSB. In particular, the decision threshold 204 corresponds to $w_3+w_2$ and the decision threshold 205 corresponds to $w_3-w_2$. Since the calibration signal with increasing or decreasing signal level is input during the $3^{rd}$ calibration measurement, the threshold crossings around $w_3-w_2$ and $w_3+w_2$ can be detected in the comparison signals 151-1, ..., 151-4 of the comparator circuits 150-1, ..., 150-4. Accordingly, two measurements value $w_3-w_2$ and $w_3+w_2$ for the weight $w_2$ of the sampling cells 120-1 and 120-2 of the $2^{nd}$ MSB are obtained. By subtracting the measurements value $w_3-w_2$ and $w_3+w_2$ from each other, an estimate for the weight $w_2$ of the sampling cells 120-1 and 120-2 of the $2^{nd}$ MSB may be obtained by the calibration circuit 160. In other words, a DC value is swept into the SAR ADC until the threshold crossings around $w_3-w_2$ and $w_3+w_2$ are detected. Subtracting these values gives an estimate for $w_2$.

For the $4^{th}$ calibration measurement, the calibration circuit 160 in the example of FIG. 1 is configured to respectively control the second switch circuits of the sampling cells 130-1 and 130-2 for the $3^{rd}$ MSB to sequentially couple the respective second cell input and the respective third cell input to the respective capacitive element. For example, the second switch circuits of the sampling cells 130-1 and 130-2 for the $3^{rd}$ MSB may be controlled to first couple (only, exclusively) the respective second cell input to the respective capacitive element and then (only, exclusively) the respective third cell input, or vice versa.

Further, since i=4>2, the calibration circuit 160 is configured to respectively control the second switch circuits of the sampling cells 110-1 and 110-2 for the $1^{st}$ MSB and the sampling cells 120-1 and 120-2 for the $2^{nd}$ MSB to couple the selected one of the respective second cell input and the respective third cell input to the respective capacitive element.

Further, the calibration circuit 160 is configured to respectively control the second switch circuits of one half of the sampling cells for the $4^{th}$ MSBs to couple the respective second cell input to the respective capacitive element, and to respectively control the second switch circuits of the other half of the sampling cells for the $4^{th}$ MSBs to couple the respective third cell input to the respective capacitive element. For example, the second switch circuit of the sampling cell 140-1 may be controlled to couple its second cell input to its capacitive element, and the sampling cell 140-2 may be controlled to couple its third cell input to its capacitive element.

For the $4^{th}$ calibration measurement, the decision threshold for the comparator circuits 150-1, ..., 150-4 is therefore sequentially set to the decision thresholds 206 and 207, which convey information about the weight $w_1$ of the sampling cells 130-1 and 130-2 of the $3^{rd}$ MSB. In particular, the decision threshold 206 corresponds to $w_3+w_2+w_1$ and the decision threshold 207 corresponds to $w_3+w_2-w_1$. Since the calibration signal with increasing or decreasing signal level is input during the $4^{th}$ calibration measurement, the threshold crossings around $w_3+w_2-w_1$ and $w_3+w_2+w_1$ can be detected in the comparison signals 151-1, ..., 151-4 of the comparator circuits 150-1, ..., 150-4. Accordingly, two measurements value $w_3+w_2-w_1$ and $w_3+w_2+w_1$ for the weight $w_1$ of the sampling cells 130-1 and 130-2 of the $3^{rd}$ MSB are obtained. By subtracting the measurements value $w_3+w_2-w_1$ and $w_3+w_2+w_1$ from each other, an estimate for the weight $w_1$ of the sampling cells 130-1 and 130-2 of the $3^{rd}$ MSB may be obtained by the calibration circuit 160. In other words, a DC value is swept into the SAR ADC until the threshold crossings around $w_3+w_2-w_1$ and $w_3+w_2+w_1$ are detected. Subtracting these values gives an estimate for $w_1$.

As described above, the calibration circuit 160 is configured to determine a respective value for the weight of the sampling cells for the i−1st MSB based on the comparison signal(s) for the i-th calibration measurement.

The last determined threshold is a linear combination of $w_3$, $w_2$ and $w_1$, but not of the weight $w_0$ of the n-th MSB (i.e. the LSB) of the SAR ADC 100. In order to determine the weight $w_0$ of the n-th MSB, an n+1st calibration measurement.

For the n+1st calibration measurement, the calibration circuit 160 is configured to control the second switch circuits of the sampling cells for the bits up to the n−$1^{st}$ MSB to couple the selected one of the respective second cell input and the respective third cell input to the respective capacitive element. Further, the calibration circuit 160 is configured to control the second switch circuits of the sampling cells for the n-th MSB (i.e. the LSB) to sequentially couple the respective second cell input and the respective third cell input to the respective capacitive element.

For the n+1st calibration measurement, the calibration circuit 160 is again configured to control the respective first switch circuit of the sampling cells for each bit of the n=4-bit to couple the respective first cell input to the respective capacitive element during calibration.

In the above example, the n+1st calibration measurement is the $5^{th}$ calibration measurement. For the $5^{th}$ calibration measurement, the calibration circuit 160 in the example of FIG. 1 is configured to respectively control the second switch circuits of the sampling cells 110-1 and 110-2 for the $1^{st}$ MSB, the sampling cells 120-1 and 120-2 for the $2^{nd}$ MSB and the sampling cells 130-1 and 130-2 for the $3^{rd}$ MSB to couple the selected one of the respective second cell input and the respective third cell input to the respective capacitive element.

Additionally, the calibration circuit 160 is configured to respectively control the second switch circuits of the sampling cells 140-1 and 140-2 for the $4^{th}$ MSB to sequentially couple the respective second cell input and the respective third cell input to the respective capacitive element. For example, the second switch circuits of the sampling cells 140-1 and 140-2 for the $4^{th}$ MSB may be controlled to first couple (only, exclusively) the respective second cell input to the respective capacitive element and then (only, exclusively) the respective third cell input, or vice versa. Initializing the SAR ADC LSB may be done very easy: One gate in the LSB feedback path may be added or replaced. Since the LSB uses a small capacitor, the required strength of the gates in this path is small and the power increase to maintain low latency is small.

Figure 3:
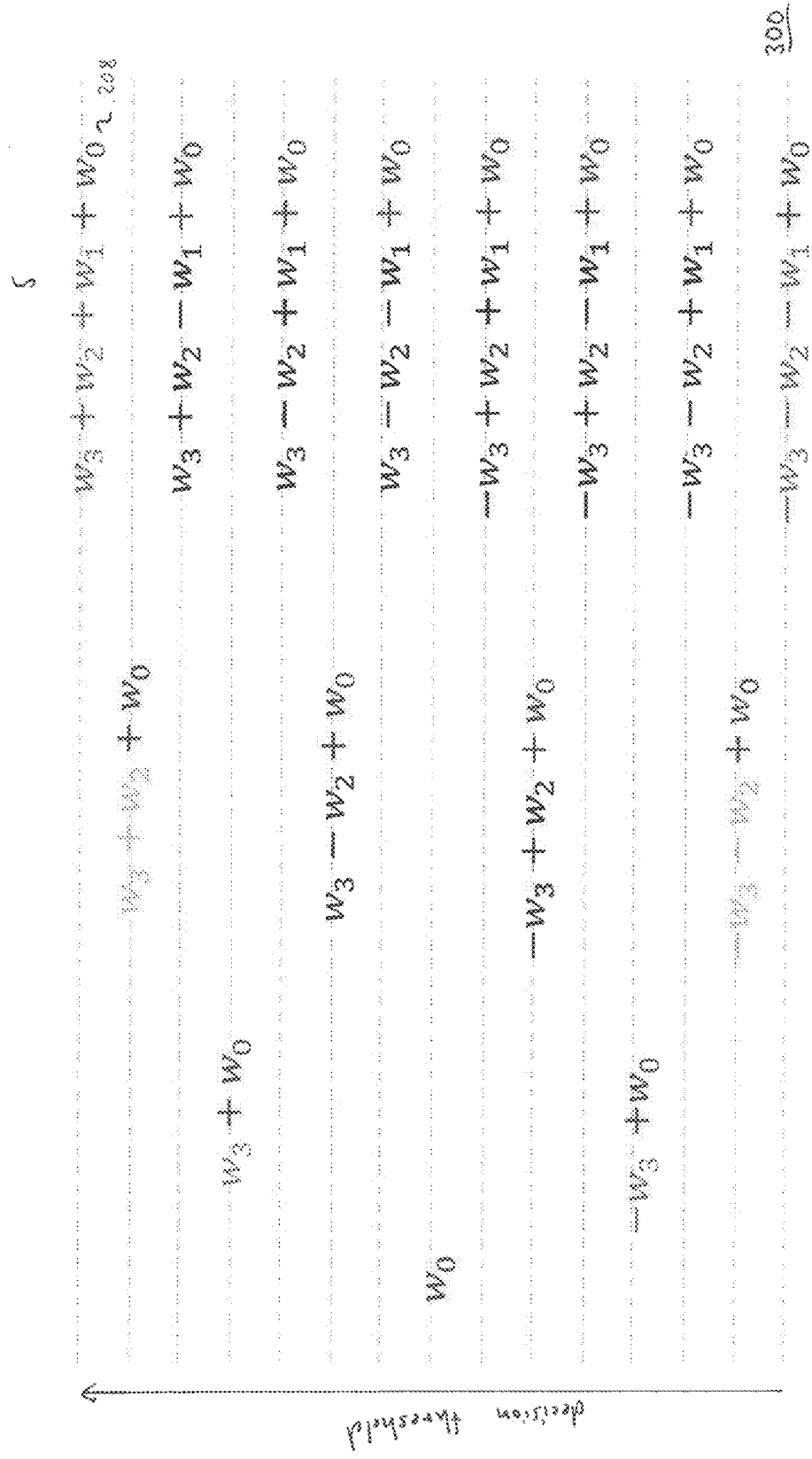
FIG. 3 illustrates a second example of decision thresholds.

For the $5^{th}$ calibration measurement, the decision threshold for the comparator circuits 150-1, . . . , 150-4 is therefore sequentially set to the decision thresholds 208 and 209, which convey information about the weight $w_0$ of the sampling cells 140-1 and 140-2 of the $4^{th}$ MSB. The decision threshold 208 is illustrated in FIG. 3. FIG. 3 illustrates a modified decision tree 300 assuming that the sampling cells 140-1 and 140-2 for the $4^{th}$ MSB couple the respective second cell input to the respective capacitive element. The decision threshold 209 is illustrated in FIG. 4. FIG. 4 illustrates a modified decision tree 400 assuming that the sampling cells 140-1 and 140-2 for the $4^{th}$ MSB couple the respective third cell input to the respective capacitive element.

As can be seen from FIGS. 3 and 4, the decision threshold 208 corresponds to $w_3+w_2+w_1+w_0$ and the decision threshold 209 corresponds to $w_3+w_2+w_1-w_0$. Since the calibration signal with increasing or decreasing signal level is input during the $5^{th}$ calibration measurement, the threshold crossings around $w_3+w_2+w_1-w_0$ and $w_3+w_2+w_1+w_0$ can be detected in the comparison signals 151-1, . . . , 151-4 of the comparator circuits 150-1, . . . , 150-4. Accordingly, two measurements value $w_3+w_2+w_1-w_0$ and $w_3+w_2+w_1+w_0$ for the weight $w_0$ of the sampling cells 140-1 and 140-2 of the $4^{th}$ MSB are obtained. By subtracting the measurements value $w_3+w_2+w_1-w_0$ and $w_3+w_2+w_1+w_0$ from each other, an estimate for the weight $w_0$ of the sampling cells 140-1 and 140-2 of the $4^{th}$ MSB may be obtained by the calibration circuit 160. In other words, a DC value is swept into the SAR ADC until the threshold crossings around $w_3\pm w_2\pm w_1-w_0$ and $w_3+w_2+w_1+w_0$ are detected. Subtracting these values gives an estimate for $w_0$.

As described above, the calibration circuit 160 is configured to determine a value for the weight of the sampling cells for the n-th MSB based on the comparison signal(s) for the n+1st calibration measurement.

Using the proposed calibration scheme, weights for all n-bits of the SAR ADC 100 may be estimated. In particular, the weight $w_0$ for the LSB of the SAR ADC 100 may be estimated.

Figure 5:
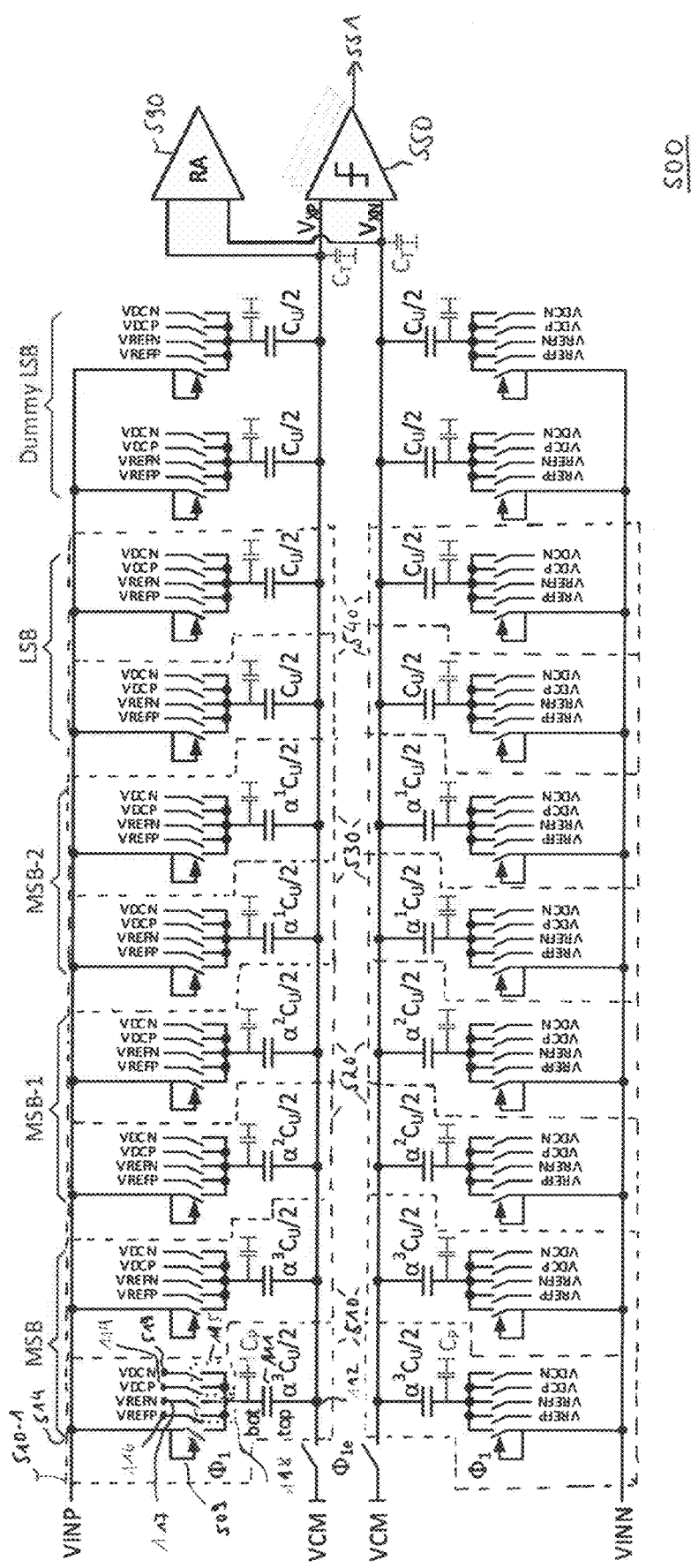
FIG. 5 illustrates another example of a n-bit SAR ADC.

The above described SAR ADC 100 is a single-ended ADC. It is to be noted that the above described calibration scheme may as well be used for a differential SAR ADC. An example of a differential n-bit SAR ADC 500 is illustrated in FIG. 5. In the example of FIG. 5, the SAR ADC 500 is depicted as an n=4-bit ADC.

Like the SAR ADC 100, the SAR ADC 500 comprises a respective plurality of sampling cells 510, 520, 530, 540 for each bit of n=4-bit. Further, the SAR ADC 500 comprises at least one comparator circuit 550 coupled to (the cell outputs of) the sampling cells of the pluralities of sampling cells 510, . . . , 540. Accordingly, the at least one comparator circuit 550 is configured to output a comparison signal 551 based on the cell output signals of the sampling cells of the pluralities of sampling cells 510, . . . , 540. A residue amplifier 590 is coupled between the sampling cells of the pluralities of sampling cells 510, . . . , 540 and the at least one comparator circuit 550 in order to amplify the cell output signals of the sampling cells.

The calibration circuit of the SAR ADC 500 is not illustrated in FIG. 5 for reasons of simplicity. However, as described above for the SAR ADC 100, the calibration circuit of the SAR ADC 500 receives the comparison signal 551 of the at least one comparator circuit 550 and controls the switching circuits of the sampling cells.

The structure of the SAR ADC 500 is, hence substantially similar to that of the SAR ADC 100 described above. Therefore, the SAR ADC 500 may be calibrated as described above.

Merely the structure of the sampling cells of the SAR ADC 500 is different from the structure of the sampling cells of the SAR ADC 100 described above. The difference between the sampling cells will be described in the following by comparing the sampling cell 110-1 of the SAR ADC 100 with the sampling cell 510-1 of the SAR ADC 500.

In the sampling cell 110-1, the first cell input 114 is used for receiving the first signal (i.e. the calibration signal) during calibration and for receiving an input signal (i.e. a fifth signal) to be digitized during non-calibration operation of the SAR ADC 100. The sampling cell 510-1 comprises an additional fourth cell input (node) 514 for receiving the input signal to be digitized during non-calibration operation of the SAR ADC 500. Additionally, the sampling cell 510-1 comprises a third switch circuit 509 capable of selectively coupling the fourth cell input 514 to the capacitive element 111 of the sampling cell 510-1 based on a clock signal $\Phi_1$ in order to sample the input signal.

Further, the sampling cell 510-1 comprises an additional fifth cell input 519 for receiving a fourth signal. The fourth is another calibration signal and exhibits opposite polarity compared to the first signal. The first switch circuit 115 is capable of selectively coupling one of the first cell input 114 and the fifth cell input 519 to the capacitive element 111 in the example of FIG. 5. The calibration circuit of the SAR ADC 500 is accordingly configured to control the first switch circuit 115 to couple a selected one of the first cell input 114 and the fifth cell input 519 to the capacitive element during calibration (e.g. for the r-th calibration measurements with r>1). Accordingly, the fifth signal may be used for calibration instead of the first signal. Alternatively, the calibration may be performed using one of the first signal and the fifth signal, and subsequently using the other of the first signal and the fifth signal.

It is to be noted that in other examples, the differential SAR ADC 500 may alternatively use the sampling cell structure as described above for the SAR ADC 100. Similarly, the SAR ADC 100 may use the sampling cell structure described for the SAR ADC 500.

Figure 6:
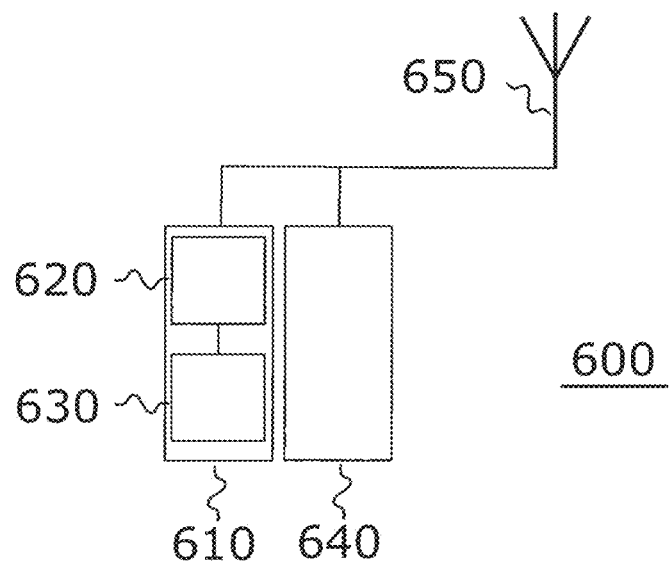
FIG. 6 illustrates an example of a base station.

An example of an implementation using a n-bit SAR ADC according to one or more aspects of the architecture described above in connection with FIGS. 1 to 5 or one or more examples described above in connection with FIGS. 1 to 5 is illustrated in FIG. 6. FIG. 6 schematically illustrates an example of a radio base station 600 (e.g. for a femtocell, a picocell, a microcell or a macrocell) comprising a n-bit SAR ADC 620 as proposed.

The n-bit SAR ADC 620 is part of a receiver 610. The receiver 610 additionally comprises a signal generation circuit 630 coupled to the n-bit SAR ADC 620. The signal generation circuit 630 is configured to generate the first signal (e.g. exhibiting an increasing or decreasing signal level over time) for calibrating the n-bit SAR ADC 620.

The receiver 610 is coupled to an antenna element 650 of the base station 600 (either directly or indirectly via one or more intermediate elements such as a filter or a Low Noise Amplifier, LNA). The n-bit SAR ADC 620 is coupled to the antenna element 650 for digitizing a radio frequency receive signal received by the antenna element 650.

Further, the base station 600 comprises a transmitter 640 configured to generate a radio frequency transmit signal. The transmitter 640 may use the antenna element 650 or another antenna element (not illustrated) of the base station 600 for radiating the radio frequency transmit signal to the environment.

To this end, a base station with a SAR ADC enabling facilitated calibration may be provided.

The base station 600 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 7:
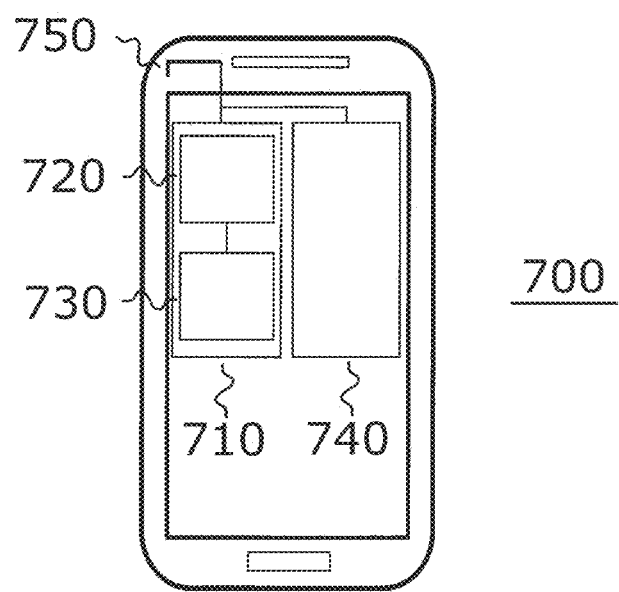
FIG. 7 illustrates an example of a mobile device.

Another example of an implementation using a n-bit SAR ADC according to one or more aspects of the architecture described above in connection with FIGS. 1 to 5 or one or more examples described above in connection with FIGS. 1 to 5 is illustrated in FIG. 7. FIG. 7 schematically illustrates an example of a mobile device 700 (e.g. mobile phone, smartphone, tablet-computer, or laptop) comprising a n-bit SAR ADC 720 as proposed.

The n-bit SAR ADC 720 is part of a receiver 710. The receiver 710 additionally comprises a signal generation circuit 730 coupled to the n-bit SAR ADC 620. The signal generation circuit 730 is configured to generate the first signal (e.g. exhibiting an increasing or decreasing signal level over time) for calibrating the n-bit SAR ADC 720.

The receiver 710 is coupled to an antenna element 750 of the mobile device 700 (either directly or indirectly via one or more intermediate elements such as a filter or an LNA). The n-bit SAR ADC 720 is coupled to the antenna element 750 for digitizing a radio frequency receive signal received by the antenna element 750.

Further, the mobile device 700 comprises a transmitter 740 configured to generate a radio frequency transmit signal. The transmitter 740 may use the antenna element 750 or another antenna element (not illustrated) of the mobile device 700 for radiating the radio frequency transmit signal to the environment.

To this end, a mobile device with a SAR ADC enabling facilitated calibration may be provided.

The mobile device 700 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using a SAR ADC according to the proposed architecture or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 8:
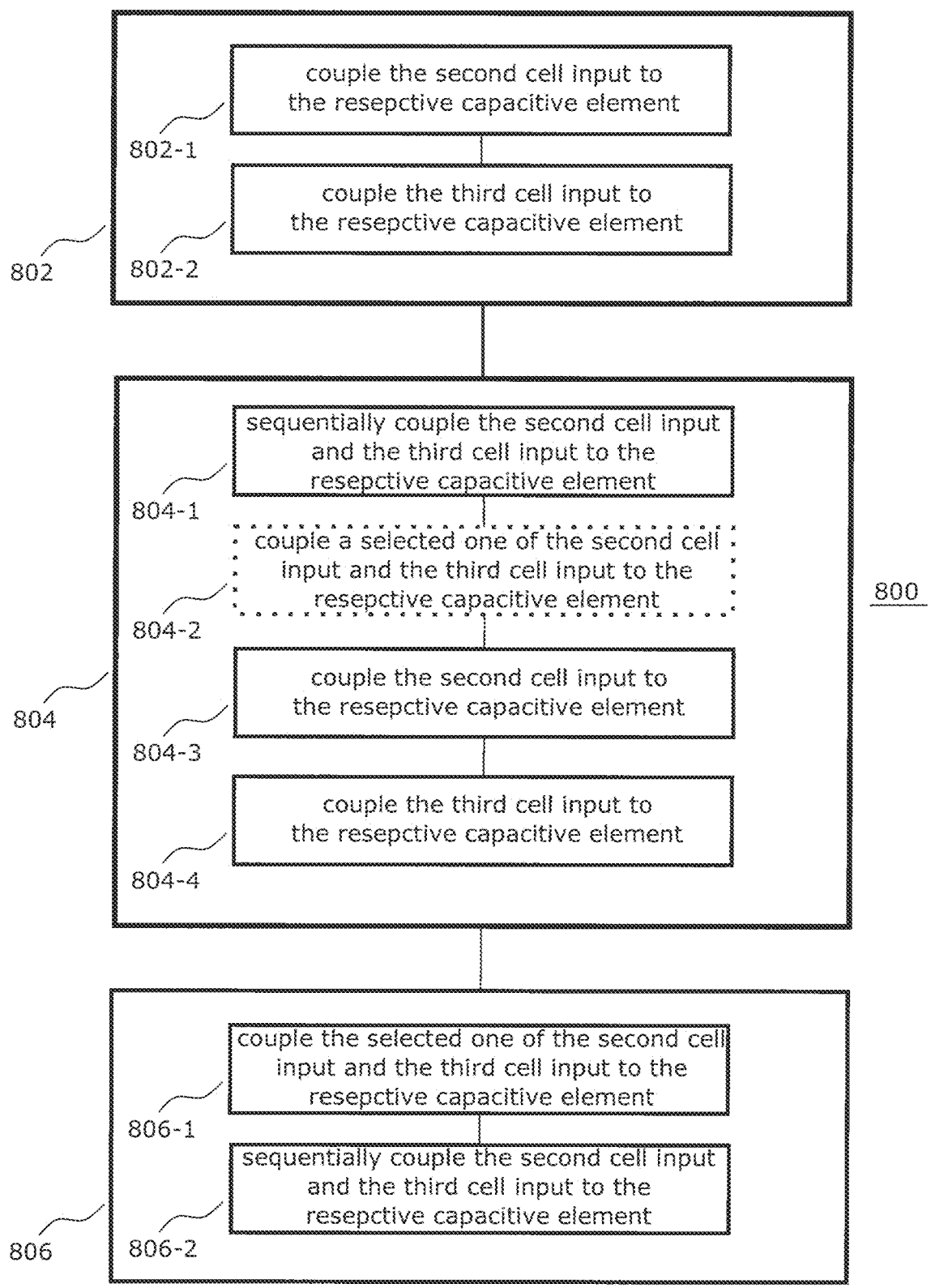
FIG. 8 illustrates a flowchart of an example of a method for calibrating a n-bit SAR ADC.

For further illustrating the SAR ADC calibration described above, FIG. 8 illustrates a flowchart of a method 800 for calibrating one of the above described n-bit SAR ADCs. For a first calibration measurement 802, the method 800 comprises controlling 802-1 the second switch circuits of one half of the sampling cells for each bit of the n-bit to couple the respective second cell input to the respective capacitive element, and controlling 802-2 the second switch circuits of the other half of the sampling cells for each bit of the n-bit to couple the respective third cell input to the respective capacitive element.

For i-th calibration measurements 804 (1<i<n+1), the method 800 comprises controlling 804-1 the second switch circuits of the sampling cells for the i−1st most significant bit among the n-bits to sequentially couple the respective second cell input and the respective third cell input to the respective capacitive element. Further, if i>2, the method 800 additionally comprises controlling 804-2 the second switch circuits of the sampling cells for the bits up to the i−2nd most significant bit to couple a selected one of the respective second cell input and the respective third cell input to the respective capacitive element. For the i-th calibration measurements 804, the method 800 comprises controlling 804-3 the second switch circuits of one half of the sampling cells for each of the i-th to n-th most significant bits to couple the respective second cell input to the respective capacitive element, and controlling 804-4 the second switch circuits of the other half of the sampling cells for each of the i-th to n-th most significant bits to couple the respective third cell input to the respective capacitive element.

For a n+1 st calibration measurement 806, the method 800 comprises controlling 806-1 the second switch circuits of the sampling cells for the bits up to the n−1$^{st}$ most significant bits to couple the selected one of the respective second cell input and the respective third cell input to the respective capacitive element, and controlling 806-2 the second switch circuits of the sampling cells for the n-th most significant bit to sequentially couple the respective second cell input and the respective third cell input to the respective capacitive element.

The method 800 may allow facilitated calibration of the n-bit SAR ADC.

Optionally, the method 800 may comprise one or more optional features such as, e.g., determining a respective value for the weight of the sampling cells for the i−1$^{st}$ most significant bit based on the comparison signal for the i-th calibration measurement, determining a value for the weight of the sampling cells for the n-th most significant bit based on the comparison signal for the n+1st calibration measurement, or selecting the selected one of the respective second cell input and the respective third cell input based on the comparison signal for the first calibration measurement.

More details and aspects of the method 800 are explained in connection with the proposed technique or one or more examples described above (e.g. FIGS. 1 to 5). The method 800 may comprise one or more additional optional features corresponding to one or more aspects of the proposed technique or one or more examples described above.

The examples described herein may be summarized as follows:

Example 1 is a n-bit SAR ADC, comprising: a respective plurality of sampling cells for each bit of the n-bit of the SAR ADC, wherein each sampling cell comprises: a capacitive element coupled to a cell output of the sampling cell in order to provide a cell output signal; a first cell input for receiving a first signal; a first switch circuit capable of selectively coupling the first cell input to the capacitive element; a second cell input for receiving a second signal; a third cell input for receiving a third signal, wherein the third signal exhibits opposite polarity compared to the second signal; and a second switch circuit capable of selectively coupling one of the second cell input and the third cell input to the capacitive element; at least one comparator circuit coupled to the sampling cells, wherein the at least one comparator circuit is configured to output a comparison signal based on the cell output signals of the sampling cells; and a calibration circuit configured to supply at least one respective control signal to the respective second switch circuit of the sampling cells for controlling the second switch circuits.

Example 2 is the n-bit SAR ADC of example 1, wherein, for a first calibration measurement, the calibration circuit is configured to: control the second switch circuits of one half of the sampling cells for each bit of the n-bit to couple the second cell input to the respective capacitive element; and control the second switch circuits of the other half of the sampling cells for each bit of the n-bit to couple the third cell input to the respective capacitive element.

Example 3 is the n-bit SAR ADC of example 2, wherein, for i-th calibration measurements with 1<i<n+1, the calibration circuit is configured to respectively: control the second switch circuits of the sampling cells for the i−1st most significant bit of the n-bit to sequentially couple the second cell input and the third cell input to the respective capacitive element; if i>2, control the second switch circuits of the sampling cells for the bits up to the i−2nd most significant bit to couple a selected one of the second cell input and the third cell input to the respective capacitive element; control the second switch circuits of one half of the sampling cells for each of the i-th to n-th most significant bits to couple the second cell input to the respective capacitive element; and control the second switch circuits of the other half of the sampling cells for each of the i-th to n-th most significant bits to couple the third cell input to the respective capacitive element.

Example 4 is the n-bit SAR ADC of example 3, wherein the calibration circuit is configured to determine a respective value for the weight of the sampling cells for the i−1st most significant bit based on the comparison signal for the i-th calibration measurement.

Example 5 is the n-bit SAR ADC of example 3 or example 4, wherein, for a n+1st calibration measurement, the calibration circuit is configured to: control the second switch circuits of the sampling cells for the bits up to the n−1$^{st}$ most significant bit to couple the selected one of the second cell input and the third cell input to the respective capacitive element; and control the second switch circuits of the sampling cells for the n-th most significant bit to sequentially couple the second cell input and the third cell input to the respective capacitive element.

Example 6 is the n-bit SAR ADC of example 5, wherein the calibration circuit is configured to determine a value for the weight of the sampling cells for the n-th most significant bit based on the comparison signal for the n+1st calibration measurement.

Example 7 is the n-bit SAR ADC of any of examples 3 to 6, wherein the calibration circuit is configured to select the selected one of the second cell input and the third cell input based on the comparison signal for the first calibration measurement.

Example 8 is the n-bit SAR ADC of any of examples 3 to 7, wherein the first cell input of at least one of the sampling cells is a cell input of the respective sampling cell used for receiving an input signal to be digitized during non-calibration operation of the n-bit SAR ADC.

Example 9 is the n-bit SAR ADC of any of examples 3 to 7, wherein at least one of the sampling cells further comprises: a fourth cell input for receiving an input signal to be digitized during non-calibration operation of the n-bit SAR ADC, and a third switch circuit capable of selectively coupling the fourth cell input to the capacitive element based on a clock signal in order to sample the input signal.

Example 10 is the n-bit SAR ADC of any of examples 3 to 9, wherein the calibration circuit is configured to selectively control the respective first switch circuit to couple the respective first cell input to the capacitive element during calibration.

Example 11 is the n-bit SAR ADC of any of examples 1 to 9, wherein each sampling cell comprises a respective fifth cell input for receiving a fourth signal, wherein the fourth signal exhibits opposite polarity compared to the first signal, and wherein the respective first switch circuit is capable of selectively coupling one of the respective first cell input and the respective fifth cell input to the respective capacitive element.

Example 12 is the n-bit SAR ADC of example 11, wherein the calibration circuit is configured to selectively control the respective first switch circuit to couple a selected one of the respective first cell input and the respective fifth cell input to the respective capacitive element during calibration.

Example 13 is the n-bit SAR ADC of any of examples 1 to 12, wherein the capacitive elements of a respective one of the pluralities of sampling cells for the individual bits of the n-bit exhibit the same capacitance.

Example 14 is the n-bit SAR ADC of any of examples 1 to 13, wherein the capacitive elements of different ones of the pluralities of sampling cells for the individual bits of the n-bit exhibit different capacitances.

Example 15 is the n-bit SAR ADC of example 14, wherein the capacitive elements of a respective one of the pluralities of sampling cells for the individual bits of the n-bit exhibit a respective capacitance which corresponds to the significance of the respective bit.

Example 16 is the n-bit SAR ADC of any of examples 1 to 15, wherein n>1.

Example 17 is the n-bit SAR ADC of any of examples 1 to 16, wherein the first signal is a calibration signal, wherein the second signal is a first reference signal, and wherein the third signal is a second reference signal.

Example 18 is the n-bit SAR ADC of any of examples 1 to 17, wherein the calibration circuit is configured to supply the respective control signal the respective second switch circuit of the sampling cells in order to adjust a decision threshold for the at least one comparator circuit during calibration.

Example 19 is a receiver, comprising: an n-bit SAR ADC according to any of examples 1 to 18; and a signal generation circuit configured to generate the first signal.

Example 20 is the receiver of example 19, wherein the first signal exhibits an increasing or decreasing signal level.

Example 21 is a base station, comprising: a receiver according to example 19 or example 20; and at least one antenna element coupled to the receiver.

Example 22 is the base station of example 21, further comprising a transmitter configured to supply a radio frequency transmit signal to the antenna element for radiation to the environment.

Example 23 is a mobile device, comprising: a receiver according to example 19 or example 20; and at least one antenna element coupled to the receiver.

Example 24 is the mobile device of example 23, further comprising a transmitter configured to supply a radio frequency transmit signal to the antenna element for radiation to the environment.

Example 25 is a method for calibrating the n-bit SAR ADC according to any of examples 1 to 18, the method comprising: for a first calibration measurement: controlling the second switch circuits of one half of the sampling cells for each bit of the n-bit to couple the second cell input to the respective capacitive element; and controlling the second switch circuits of the other half of the sampling cells for each bit of the n-bit to couple the third cell input to the respective capacitive element, for i-th calibration measurements with $1<i<n+1$: controlling the second switch circuits of the sampling cells for the i$-1^{st}$ most significant bit among the n-bits to sequentially couple the second cell input and the third cell input to the respective capacitive element; if i>2, controlling the second switch circuits of the sampling cells for the bits up to the i-2nd most significant bit to couple a selected one of the second cell input and the third cell input to the respective capacitive element; controlling the second switch circuits of one half of the sampling cells for each of the i-th to n-th most significant bits to couple the second cell input to the respective capacitive element; and controlling the second switch circuits of the other half of the sampling cells for each of the i-th to n-th most significant bits to couple the third cell input to the respective capacitive element, and for a n+1st calibration measurement: controlling the second switch circuits of the sampling cells for the bits up to the n$-1^{st}$ most significant bit to couple the selected one of the second cell input and the third cell input to the respective capacitive element; and controlling the second switch circuits of the sampling cells for the n-th most significant bit to sequentially couple the second cell input and the third cell input to the respective capacitive element.

Example 26 is the method of example 25, further comprising: determining a respective value for the weight of the sampling cells for the i$-1^{st}$ most significant bit based on the comparison signal for the i-th calibration measurement.

Example 27 is the method of example 25 or example 26, further comprising: determining a value for the weight of the sampling cells for the n-th most significant bit based on the comparison signal for the n+1st calibration measurement.

Example 28 is the method of any of examples 25 to 27, further comprising: selecting the selected one of the second cell input and the third cell input based on the comparison signal for the first calibration measurement.

Example 29 is the method of any of examples 25 to 28, wherein the first signal exhibits an increasing or decreasing signal level.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A n-bit Successive Approximation Register Analog-to-Digital Converter, SAR ADC, comprising:
   a respective plurality of sampling cells for each bit of the n-bit of the SAR ADC, wherein each sampling cell comprises:
      a capacitive element coupled to a cell output of the sampling cell in order to provide a cell output signal;
      a first cell input for receiving a first signal;
      a first switch circuit capable of selectively coupling the first cell input to the capacitive element;
      a second cell input for receiving a second signal;
      a third cell input for receiving a third signal, wherein the third signal exhibits opposite polarity compared to the second signal; and
      a second switch circuit capable of selectively coupling one of the second cell input and the third cell input to the capacitive element;
   at least one comparator circuit coupled to the sampling cells, wherein the at least one comparator circuit is configured to output a comparison signal based on the cell output signals of the sampling cells; and
   a calibration circuit configured to supply at least one respective control signal to the respective second switch circuit of the sampling cells for controlling the second switch circuits.

2. The n-bit SAR ADC of claim 1, wherein, for a first calibration measurement, the calibration circuit is configured to:
   control the second switch circuits of one half of the sampling cells for each bit of the n-bit to couple the second cell input to the respective capacitive element; and
   control the second switch circuits of the other half of the sampling cells for each bit of the n-bit to couple the third cell input to the respective capacitive element.

3. The n-bit SAR ADC of claim 2, wherein, for i-th calibration measurements with $1<i<n+1$, the calibration circuit is configured to respectively:
- control the second switch circuits of the sampling cells for the i–1st most significant bit of the n-bit to sequentially couple the second cell input and the third cell input to the respective capacitive element;
- if i>2, control the second switch circuits of the sampling cells for the bits up to the i–2nd most significant bit to couple a selected one of the second cell input and the third cell input to the respective capacitive element;
- control the second switch circuits of one half of the sampling cells for each of the i-th to n-th most significant bits to couple the second cell input to the respective capacitive element; and
- control the second switch circuits of the other half of the sampling cells for each of the i-th to n-th most significant bits to couple the third cell input to the respective capacitive element.

4. The n-bit SAR ADC of claim 3, wherein the calibration circuit is configured to determine a respective value for the weight of the sampling cells for the i–1st most significant bit based on the comparison signal for the i-th calibration measurement.

5. The n-bit SAR ADC of claim 3, wherein, for a n+1st calibration measurement, the calibration circuit is configured to:
- control the second switch circuits of the sampling cells for the bits up to the n–$1^{st}$ most significant bit to couple the selected one of the second cell input and the third cell input to the respective capacitive element; and
- control the second switch circuits of the sampling cells for the n-th most significant bit to sequentially couple the second cell input and the third cell input to the respective capacitive element.

6. The n-bit SAR ADC of claim 5, wherein the calibration circuit is configured to determine a value for the weight of the sampling cells for the n-th most significant bit based on the comparison signal for the n+1st calibration measurement.

7. The n-bit SAR ADC of claim 3, wherein the calibration circuit is configured to select the selected one of the second cell input and the third cell input based on the comparison signal for the first calibration measurement.

8. The n-bit SAR ADC of claim 3, wherein the first cell input of at least one of the sampling cells is a cell input of the respective sampling cell used for receiving an input signal to be digitized during non-calibration operation of the n-bit SAR ADC.

9. The n-bit SAR ADC of claim 3, wherein at least one of the sampling cells further comprises:
- a fourth cell input for receiving an input signal to be digitized during non-calibration operation of the n-bit SAR ADC, and
- a third switch circuit capable of selectively coupling the fourth cell input to the capacitive element based on a clock signal in order to sample the input signal.

10. The n-bit SAR ADC of claim 3, wherein the calibration circuit is configured to selectively control the respective first switch circuit to couple the respective first cell input to the capacitive element during calibration.

11. The n-bit SAR ADC of claim 1, wherein each sampling cell comprises a respective fifth cell input for receiving a fourth signal, wherein the fourth signal exhibits opposite polarity compared to the first signal, and wherein the respective first switch circuit is capable of selectively coupling one of the respective first cell input and the respective fifth cell input to the respective capacitive element.

12. The n-bit SAR ADC of claim 11, wherein the calibration circuit is configured to selectively control the respective first switch circuit to couple a selected one of the respective first cell input and the respective fifth cell input to the respective capacitive element during calibration.

13. The n-bit SAR ADC of claim 1, wherein the capacitive elements of a respective one of the pluralities of sampling cells for the individual bits of the n-bit exhibit the same capacitance.

14. The n-bit SAR ADC of claim 1, wherein the capacitive elements of different ones of the pluralities of sampling cells for the individual bits of the n-bit exhibit different capacitances.

15. The n-bit SAR ADC of claim 14, wherein the capacitive elements of a respective one of the pluralities of sampling cells for the individual bits of the n-bit exhibit a respective capacitance which corresponds to the significance of the respective bit.

16. The n-bit SAR ADC of claim 1, wherein n>1.

17. The n-bit SAR ADC of claim 1, wherein the first signal is a calibration signal, wherein the second signal is a first reference signal, and wherein the third signal is a second reference signal.

18. The n-bit SAR ADC of claim 1, wherein the calibration circuit is configured to supply the respective control signal the respective second switch circuit of the sampling cells in order to adjust a decision threshold for the at least one comparator circuit during calibration.

19. A receiver, comprising:
- an n-bit successive approximation register analog-to-digital converter according to claim 1; and
- a signal generation circuit configured to generate the first signal.

20. The receiver of claim 19, wherein the first signal exhibits an increasing or decreasing signal level.

21. A base station, comprising:
- a receiver according to claim 19; and
- at least one antenna element coupled to the receiver.

22. The base station of claim 21, further comprising a transmitter configured to supply a radio frequency transmit signal to the antenna element for radiation to the environment.

23. A method for calibrating the n-bit SAR ADC according to claim 1, the method comprising:
- for a first calibration measurement:
  - controlling the second switch circuits of one half of the sampling cells for each bit of the n-bit to couple the second cell input to the respective capacitive element; and
  - controlling the second switch circuits of the other half of the sampling cells for each bit of the n-bit to couple the third cell input to the respective capacitive element,
- for i-th calibration measurements with $1<i<n+1$:
  - controlling the second switch circuits of the sampling cells for the i–$1^{st}$ most significant bit among the n-bits to sequentially couple the second cell input and the third cell input to the respective capacitive element;
  - if i>2, controlling the second switch circuits of the sampling cells for the bits up to the i–2nd most significant bit to couple a selected one of the second cell input and the third cell input to the respective capacitive element;

controlling the second switch circuits of one half of the sampling cells for each of the i-th to n-th most significant bits to couple the second cell input to the respective capacitive element; and controlling the second switch circuits of the other half of the sampling cells for each of the i-th to n-th most significant bits to couple the third cell input to the respective capacitive element, and for a $n+1^{st}$ calibration measurement:

controlling the second switch circuits of the sampling cells for the bits up to the $n-1^{st}$ most significant bit to couple the selected one of the second cell input and the third cell input to the respective capacitive element; and controlling the second switch circuits of the sampling cells for the n-th most significant bit to sequentially couple the second cell input and the third cell input to the respective capacitive element.

24. The method of claim 23, further comprising:

determining a respective value for the weight of the sampling cells for the $i-1^{st}$ most significant bit based on the comparison signal for the i-th calibration measurement.

25. The method of claim 24, further comprising:

determining a value for the weight of the sampling cells for the n-th most significant bit based on the comparison signal for the n+1st calibration measurement.

* * * * *